(12) United States Patent
Choi

(10) Patent No.: US 6,314,027 B1
(45) Date of Patent: Nov. 6, 2001

(54) FLASH MEMORY DEVICE CAPABLE OF PREVENTING AN OVER-ERASURE OF FLASH MEMORY CELLS AND ERASE METHOD THEREOF

(75) Inventor: Ki-Hwan Choi, Sungnam-shi (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/626,172

(22) Filed: Jul. 27, 2000

(30) Foreign Application Priority Data

Jul. 28, 1999 (KR) .................................................. 99-30872

(51) Int. Cl.⁷ ...................................................... G11C 7/00
(52) U.S. Cl. .................................. 365/185.29; 365/185.3; 365/185.33; 365/185.18; 365/218
(58) Field of Search ......................... 365/185.01, 185.29, 365/185.33, 185.18, 185.3, 218

(56) References Cited

U.S. PATENT DOCUMENTS

| | | | |
|---|---|---|---|
| 5,287,317 | * | 2/1994 | Kobayashi et al. ................... 365/218 |
| 5,801,993 | * | 9/1998 | Choi ................................. 365/185.28 |
| 5,870,334 | * | 2/1999 | Hemink et al. ................... 365/185.17 |
| 5,917,755 | * | 6/1999 | Rinerson et al. ................ 365/185.29 |
| 5,917,757 | * | 6/1999 | Lee et al. ......................... 365/185.33 |
| 5,930,174 | * | 7/1999 | Chen et al. ...................... 365/185.29 |
| 5,953,255 | * | 9/1999 | Lee .................................. 365/185.29 |
| 5,963,479 | * | 10/1999 | Park et al. ....................... 365/185.29 |
| 5,963,480 | * | 10/1999 | Havavi ............................ 365/185.29 |
| 6,188,609 | * | 2/2001 | Sunkavalli et al. ............. 365/185.22 |

* cited by examiner

*Primary Examiner*—Viet Q. Nguyen
(74) *Attorney, Agent, or Firm*—Marger Johnson & McCollom, P.C.

(57) ABSTRACT

The flash memory device according to the present invention includes an erase control circuit, used as a state machine, having embodied erase algorithm which can prevent flash memory cells from being over-erased. The erase control circuit, first, checks whether or not threshold voltages of selected cells reach a predetermined pre-verify voltage higher than the maximum value of a target threshold voltage range corresponding to the erased state. When at least one of the selected cells has its threshold voltage higher than the pre-verify voltage, a high voltage generator generates a bulk voltage that is increased step by step by a predetermined voltage level. And, when the selected cells all have threshold voltages equal to or less than the pre-verify voltage, the high voltage generator generates a constant bulk voltage. According to this bulk voltage control scheme, the number of flash memory cells over-erased at the erase operation is reduced reducing the total erase time.

6 Claims, 9 Drawing Sheets

FLASH MEMORY DEVICE CAPABLE OF PREVENTING AN OVER-ERASURE OF FLASH MEMORY CELLS AND ERASE METHOD THEREOF

FIELD OF THE INVENTION

The present invention relates generally to nonvolatile memory devices and, more particularly, to a flash memory device capable of preventing flash memory cells from being over-erased and an erase method thereof.

BACKGROUND OF THE INVENTION

Nonvolatile memory devices have become increasingly popular, especially flash memory devices. FIG. 1 shows a conventional flash memory cell. The flash memory cell has source and drain regions 2 and 3, respectively, formed in a P-type semiconductor substrate 1 (or bulk), a floating gate 6 formed over a channel region 5 and between the source and drain regions 2 and 3, respectively. A thin (100 Å) insulator 4 is interposed between the floating gate 6 and the substrate 1. A control gate 8 is formed over the floating gate 6 with a second insulator 7 interposed therebetween. The control gate 8 is coupled to a word line.

Table 1 shows the conventional approach to programming, reading, erasing, and erase-verifying the flash memory cell shown in FIG. 1.

TABLE 1

|    | PROGRAM | READ   | ERASE      | VERIFY |
|----|---------|--------|------------|--------|
| Vg | +5V     | +10V   | −10V       | +3V    |
| Vd | +1V     | +5V    | FLOAT      | +5V    |
| Vs | GROUND  | GROUND | FLOAT      | GROUND |
| Vb | GROUND  | GROUND | +6V to +9V | GROUND |

The flash memory cell is programmed by applying a ground (0V) to the source 2 and the bulk 1, a high voltage of +10V to the control gate 8, and a positive voltage of +5V to the drain 3 resulting in appropriate hot electron generation. The above-described voltages cause a sufficient amount of negative charges to accumulate in the floating gate 6 creating a (−) potential. The (−) potential forces a threshold voltage of the flash memory cell to be increased during reading.

During a read operation, a voltage of +5V is applied to the control gate 8 and the ground voltage is applied to the source 3. Under these conditions, the channel of the programmed memory cell is nonconductive. That is, no current flows from the drain 3 to the source 2 via the channel 5. At this time, the programmed memory is in an off state, and its threshold voltage, as illustrated in FIG. 2, is distributed within about +7V to +9V.

Flash memory cells in a sector are simultaneously erased by means of the so-called Fowler-Nordheim (F-N) tunneling mechanism. According to the F-N tunneling mechanism, a negative high voltage of about −10V is applied to the control gate 8 of each memory cell transistor and a positive voltage between about +6V to +9V—suitable to make the F-N tunneling—is applied to the substrate 1. Under this bias condition, the drain and source 2 and 3, respectively, of each cell are maintained at a floating state as shown in Table 1. This erase scheme is termed Negative Gate and Bulk Erase (NGBE). A strong electric field between 6 to 7 MV/cm is generated between the control gate 8 and the bulk 1 under the above-described bias condition, so that negative charges accumulated in the floating gate 6 are discharged into the source 2 through the thin insulator 5. The negative charges force a reduction in the threshold voltage of the memory cell during reading.

The particulars of various bulk erase methods associated with a flash memory device are disclosed in U.S. Pat. No. 5,781,477 entitled "FLASH MEMORY SYSTEM HAVING FAST ERASE OPERATION", U.S. Pat. No. 5,132,935 entitled "ERASURE OF EEPROM MEMORY ARRAYS TO PREVENT OVER-ERASED CELLS", U.S. Pat. No. 5,220,533 entitled "METHOD AND APPARATUS FOR PREVENTING ERVERERASURE IN A FLASH CELL", U.S. Pat. No. 5,513,193 entitled "NON-VOLATITLE SEMICONDUCTOR MEMORY DEVICE CAPABLE OF CHECKING THE THRESHOLD VALUE OF MEMORY CELLS", and U.S. Pat. No. 5,805,501 entitled "FLASH MEMORY DEVICE WITH MULTIPLE CHECKPOINT ERASE SUSPEND LOGIC", incorporated herein by reference.

After performing the above-described NBGE operation, an erase verification operation is performed to check whether a threshold voltage of each flash memory cell in the sector exists in a target threshold voltage range corresponding to the on state (e.g., +1V to +3V). During the erase verification operation, as shown in Table 1, an erase verification voltage of about +3V is applied to the control gate 8, a voltage of about +5V to the drain 3, and the ground voltage (0V) to the source 2 and the bulk 1.

Typically, the threshold voltage of the erased memory cell is distributed in a range of +1V to +3V. However, when all of the memory cells in the sector are simultaneously erased, a threshold voltage of one or more flash memory cells can be lowered below +1V. When this happens the flash memory cell is termed an over-erased cell. The over-erased cell can be cured by an erase repair operation that shifts the threshold voltage of the over-erased cell back to a target threshold voltage range of the on cell (e.g., +1V to +3V).

The erase repair operation is carried out by applying the ground voltage (0V) to the source 2 and the bulk 1 of the over-erased cell, a voltage of about +3V to the control gate 8, and a voltage of about +5V the drain 3. This bias condition accumulates charges in the floating gate 6 of an amount less than those accumulated during a program operation. The erase repair operation, as illustrated in FIG. 2, results in the threshold voltage of the over-erased memory cell shifting back into the target threshold voltage distribution (e.g., +1V to +3V).

One problem associated with the above-described erase method is the length of time that it takes to perform the additional erase repair operation. This is because the repair operation increases the overall time it takes to erase the memory cell. As well known to those skilled in the art, such a problem arises when excess electric field is applied across the floating gate of the flash memory cell.

Applying a weaker electric field can lower the time it takes to perform an NGBE erase operation. The overall erase time, however, remains unchanged because while applying a weaker electric field results in none to fewer over-erased cells, eliminating the time required to perform the over-erase repair operation, the actual erase operation takes longer.

SUMMARY OF THE INVENTION

It is an object of the present invention to overcome the problems associated with conventional flash memory devices.

It is another object of the present invention to provide a flash memory device capable of reducing the total erase operation time and an erase method therefor.

It is yet another object of the present invention to provide a flash memory device capable of minimizing the number of flash memory cells over-erased during an erase operation.

According to an aspect of the present invention, there is provided a method for erasing flash memory cells in an array formed on a semiconductor substrate, each cell having and ON and an OFF state and a source, drain, and control gate. The method comprises applying a first electric field between the control gate of a corresponding memory cell and the semiconductor substrate during a first interval and step-wise incrementing the first electric field during the first interval. The method further comprises applying a second electric field between the control gate of the corresponding memory cell and the semiconductor substrate during a second interval and maintaining constant the second electric field during the second interval.

Applying the first electric field includes applying the first electric field when a threshold voltage of the corresponding memory cell is higher than a verify voltage.

Applying a second electric field includes applying a second electric field when a threshold voltage of one of the memory cells is equal to or greater than a verify voltage. during the second interval in which a threshold voltage of at least one memory cell reaches the verify voltage.

The verify voltage is greater than a maximum value of a target threshold voltage range corresponding to the ON state.

Applying the second electric field includes applying the second electric field equal in strength to the first electric field when a threshold voltage of at least one memory cell is equal to or greater than the verify voltage. Applying the first electric field further comprises erasing the memory cells by applying a negative voltage to corresponding control gates and a positive bulk voltage to the semiconductor substrate and verifying whether a threshold voltage of the corresponding memory cells is equal to or greater than the verify voltage. Applying the first electric field further comprises increasing the positive bulk voltage by a predetermined voltage when the threshold voltage of the corresponding memory cells is over the verify voltage and repeatedly erasing, verifying, and increasing until the threshold voltage of at least one memory cell is equal to or greater than the verify voltage.

According to another aspect of the present invention, there is provided a flash memory device that comprises an array of memory cells arranged in row and columns. A row selecting circuit selects at least one row responsive to a row address. A column selecting circuit selects at least one column responsive to a column address. A sense amplifier circuit senses and amplifies data bits in memory cells arranged in the selected at least one row and column. A high voltage generating circuit generates a bulk voltage applied to a bulk during an erase operation. An erase controller receives the data bits from the sense amplifier circuit. The erase controller checks if a threshold voltage of at least one of the cells reaches a verify voltage over a maximum value of a target threshold voltage range corresponding to an erased state. The erase controller controls the high voltage generating circuit so that the bulk voltage generated therefrom is stepwise increased by a predetermined voltage when the threshold voltage of the at least one cell is over the verify voltage. The erase controller controls the high voltage generating circuit such that the bulk voltage is maintained constant when the threshold voltage of the at least one cell reaches the verify voltage.

The constantly maintained bulk voltage is equal to a voltage applied to the bulk when the threshold voltage of the at least one cell reaches the verify voltage.

The flash memory device further comprises a row counter for generating the row address and a column counter for generating the column address. The erase controller increments the column counter when all of the columns are selected and increments the row counter when all of the rows are selected.

BRIEF DESCRIPTION OF THE DRAWINGS

A more complete appreciation of the present invention, and many of the attendant advantages thereof, will become readily apparent as the same becomes better understood by reference to the following detailed description when considered in conjunction with the accompanying drawings. In the drawings, like reference symbols indicate the same or similar components.

DESCRIPTION OF THE PREFERRED EMBODIMENT

The preferred embodiment of the invention will be more fully described with reference to the attached drawings.

Figure 1:
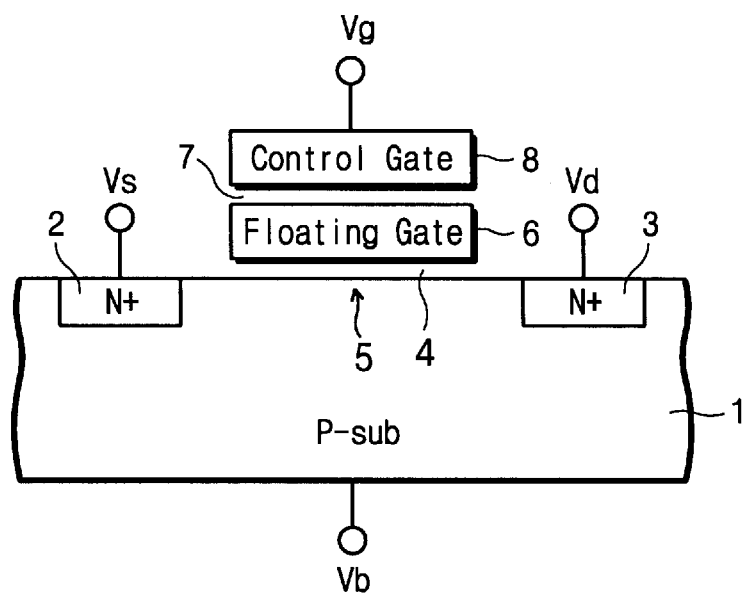
FIG. 1 is a cross-sectional diagram of a conventional flash memory cell.
Figure 2:
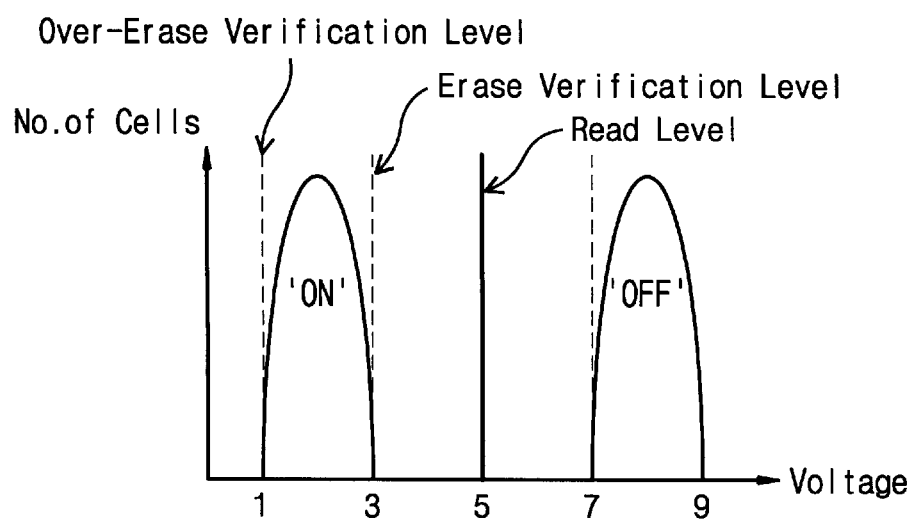
FIG. 2 is a diagram showing threshold voltage distributions for on and off cells.
Figure 3:
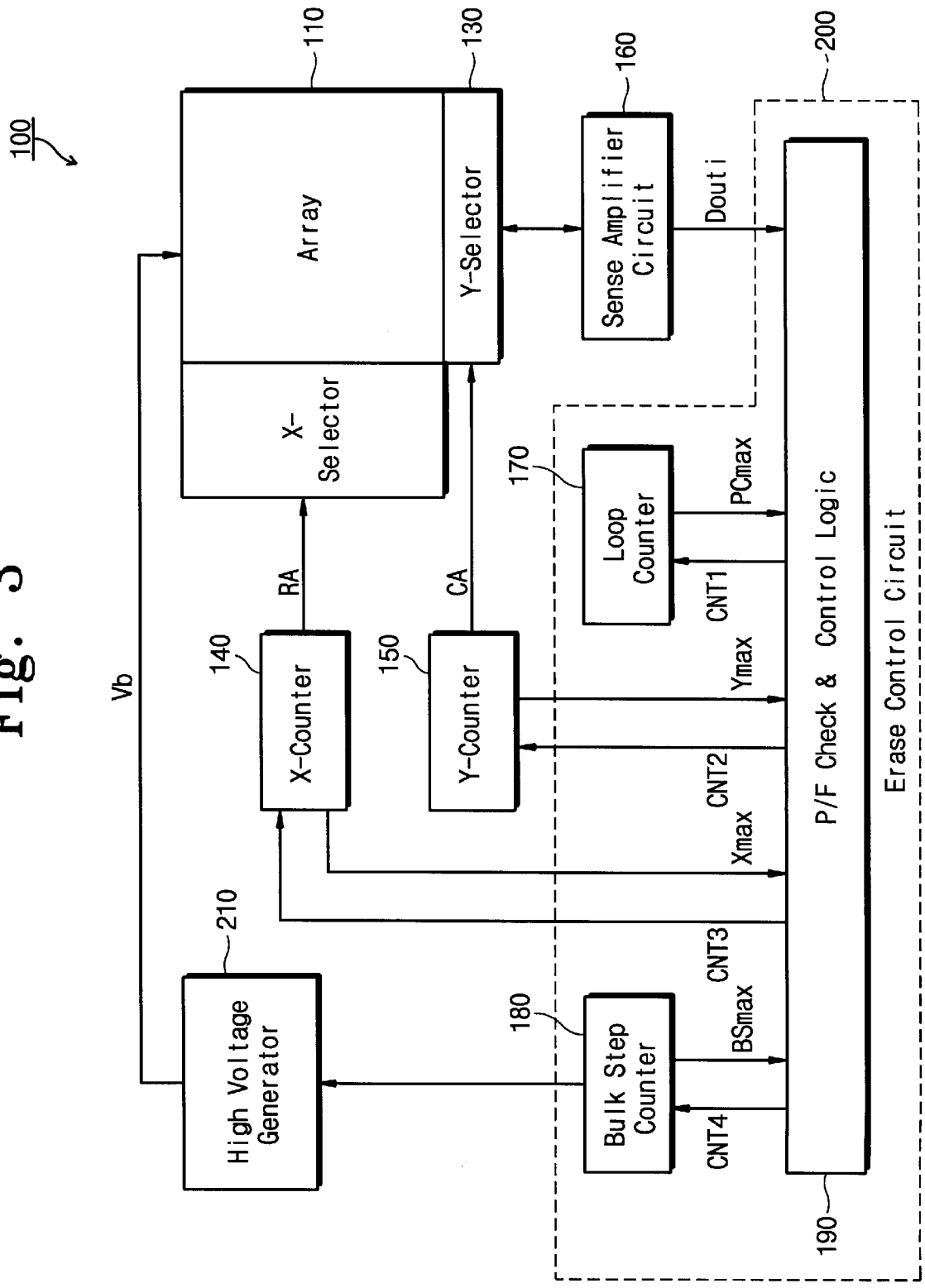
FIG. 3 is a block diagram of a flash memory device.

Referring to FIG. 3, a flash memory device is illustrated in block form. The flash memory device 100 includes an array 110 of flash memory cells having the same structure as illustrated in FIG. 1. The flash memory cells are arranged in a matrix of rows and columns. Although not illustrated in the drawing, it should readily apparent to a person of skill in the art that a plurality of word lines and a plurality of bit lines extend along the rows and the columns, respectively. The flash memory cells in the array 110 are formed on a single bulk or substrate such that they are simultaneously erased.

The cell array 110 shown in FIG. 3 corresponds to a sector or a block. A NOR-type flash memory device having a sector or block architecture is disclosed in A 3.3V-only 16 Mb Flash Memory with Row-Decoding Scheme by Kang-Deog Suh, IEEE International Solid-State Circuits Conference, vol. 2, pp. 42–43 (1996) which is hereby expressly incorporated by reference.

The NOR-type flash memory device disclosed in the Suh reference includes an array divided into a plurality of sectors or blocks. The bulk regions of each sector are electrically isolated from each other. All cells integrated in each sector are simultaneously erased during the above-described erase operation. Each sector corresponds to an erase unit, the word lines and the bit lines in one sector being selected separately from those in other sectors. Such a structure allows a disturbance-free program/erase operation resulting in high reliability.

Continuing to refer FIG. 3, the flash memory device 100 further includes row selecting circuit 120, column selecting circuit 130, X-counter 140, Y-counter 150, and sense amplifier circuit 160. The row selecting circuit 120 selects a word line in the cell array 110 responsive to row address RA generated by the X-counter 140. The row selecting circuit 120 supplies the selected word line with a word line voltage required for any of a number of operations such as program/erase/read/erase verification/erase repair operations.

The column selecting circuit 130 selects bit lines of a byte or word unit responsive to column address CA generated by the Y-counter 150. The column selecting circuit 130 supplies the selected bit lines with current and voltage (e.g., drain voltage) needed for any of a number of operations (e.g., program operation). The sense amplifier circuit 160 detects states (e.g., whether a cell is on or off) cells selected by the row and column selecting circuits 120 and 130, respectively.

The flash memory device 100 of FIG. 3 further includes an erase control circuit 200 for controlling the erase operation. The erase control circuit 200 includes a loop counter 170, a bulk step counter 180, and a pass/fail check & control logic 190, as will be more fully described below. During the erase operation, a high voltage generator 210 is provided in the flash memory device 100 for generating a bulk voltage Vb provided to the bulk (or substrate) under the control of the erase control circuit 200.

Figure 4:
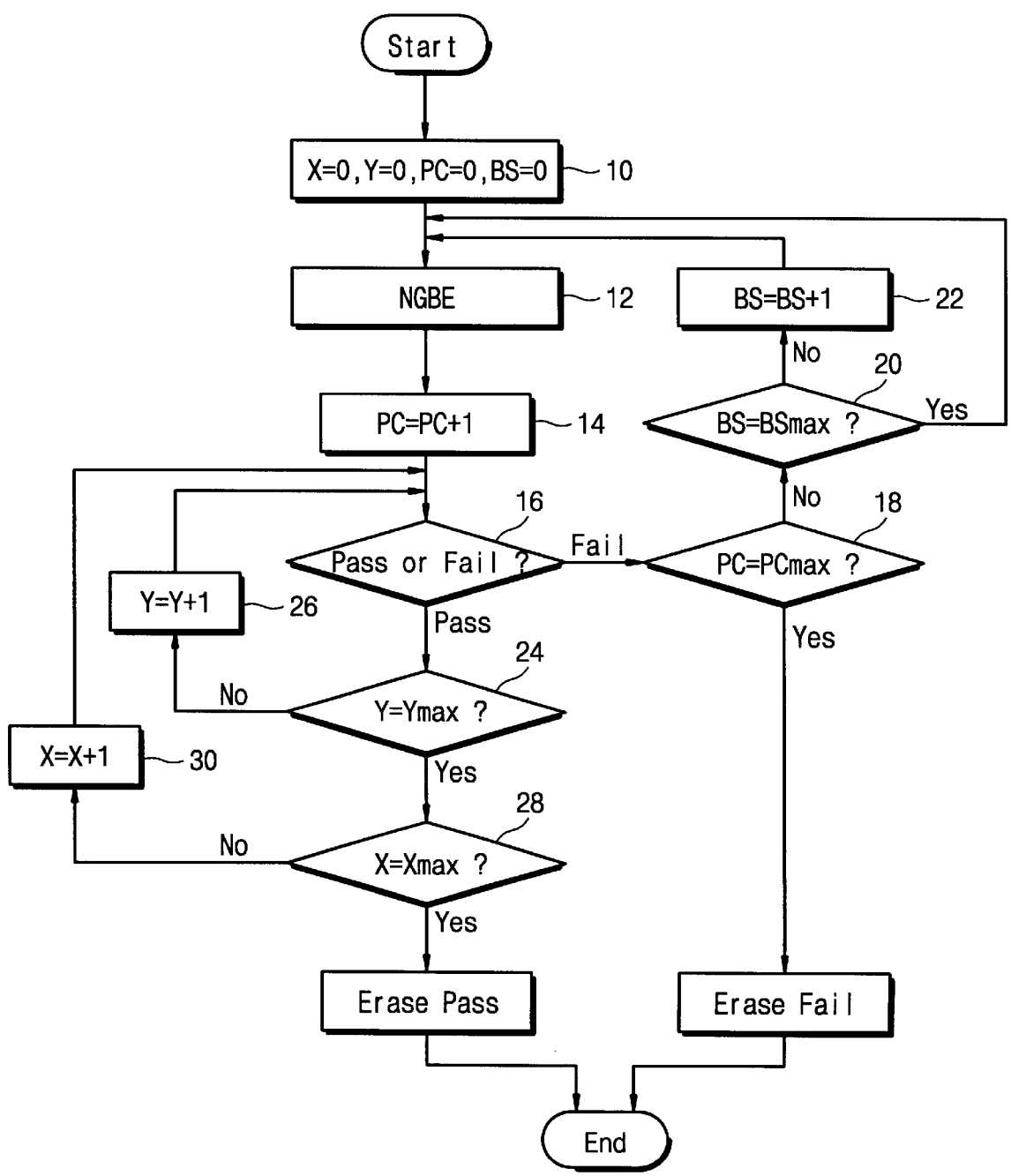
FIG. 4 is a flow chart of an erase operation.
Figure 5:
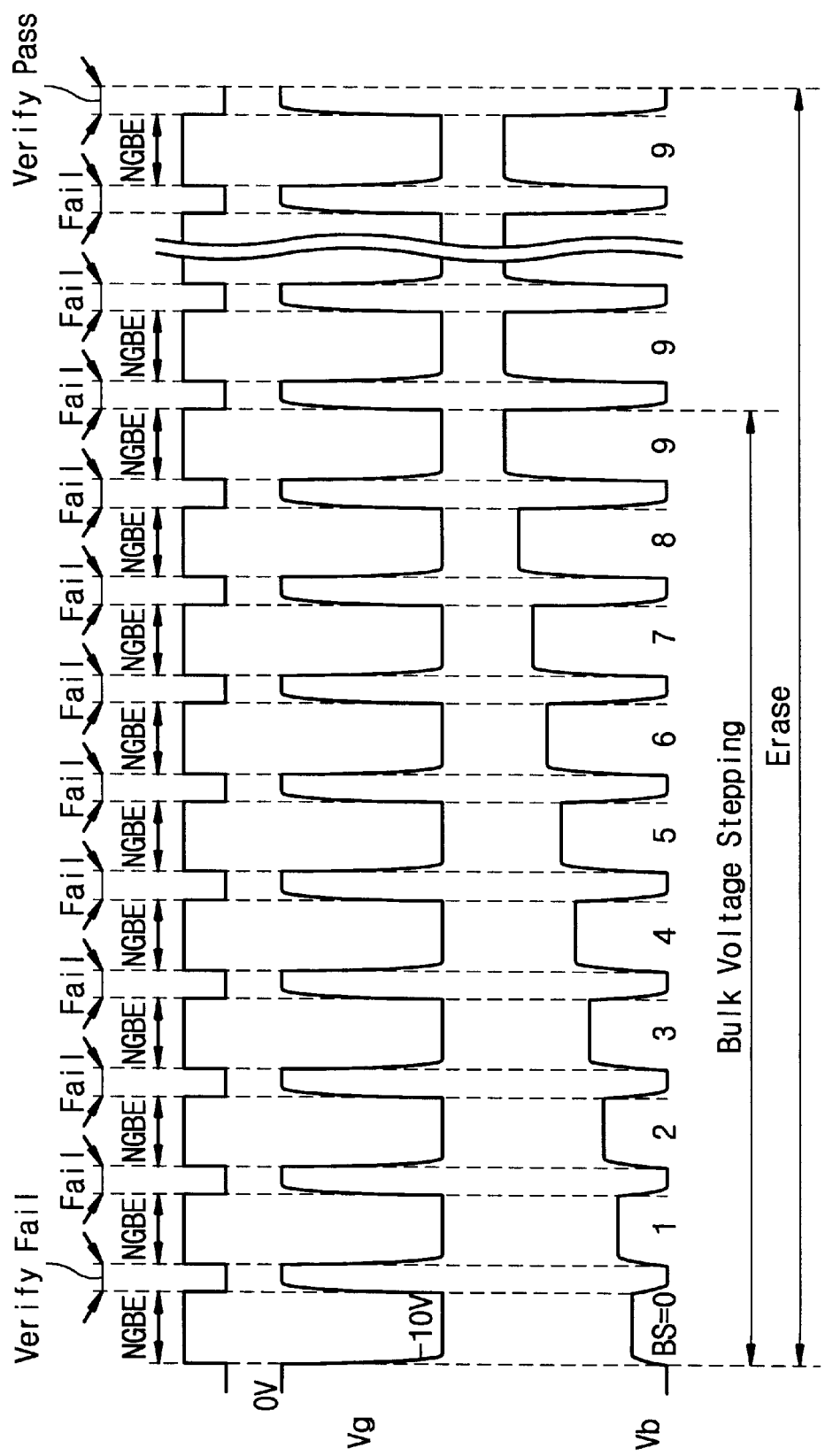
FIG. 5 is a diagram of bulk voltage variations.

FIG. 4 is a flow chart of the erase operating of the flash memory device in FIG. 3. FIG. 5 shows the variation of the bulk voltage Vb when the erase operation of FIG. 4 is applied to the device of FIG. 3. As described above, the flash memory cells in a given sector are simultaneously erased using the NGBE erase verification and erase repair operations. The erase repair operation is the same as the described previously and will not be further described.

At step 10, the values X, Y, PC, and BS of the X-counter 140, the Y-counter 150, the loop counter 170, and the bulk step counter 180, respectively, are reset to zero. At the step 12, the NGBE operation is performed under the following bias condition: a voltage Vg of −10V is applied to the control gates of all flash memory cells in the sector (or word lines therein), and a voltage Vb of +6V is applied to the bulk (substrate). As a result of the bias condition, the electric field is formed across the floating gate of each cell. At step 14 the value PC of the loop counter 170 is incremented by "1" responsive to the control signal CNT1 generated by the P/F check & control logic circuit 190.

After a predetermined time under that NGBE bias condition (e.g., Vg =−10V, Vb=+6V), the erase verification operation is carried out under the following verification bias condition, e.g., Vg=+3V, Vd=+5V, Vs=0V, and Vb=0V. The verification operation checks whether the threshold voltages of flash memory cells selected by the initially set row and column addresses are distributed in the target threshold voltage range (+1V to +3V). As is well known to those skilled in the art, the erase verification operation is carried out in the same manner as the read operation except that the bias condition of the erase verification operation is different from that of the read operation. During erase verification, data Douti (the value of i is determined by the byte or word unit) read out by the sense amplifier circuit 160 is transferred to the control logic 200.

The P/F check & control logic 200 checks whether the threshold voltages of the selected flash memory cells are lower than the maximum value (e.g., +3V) of the target threshold voltage range (step 16). If at least one of the selected cells has its threshold voltage higher than the maximum value, the P/F check & control logic 200 checks whether the value PC of the loop counter 170 is equal to its maximum value PCmax (step 18). When the value PC is equal to the maximum value PCmax, the erase operation ends as an erase fail.

On the other hand, when the value PC is less than the maximum value PCmax, the value BS of the bulk step counter 180 is checked to determine whether it is equal to its maximum value BSmax (step 20). If the value BS is less than the maximum value BSmax, the value BS is incremented by 1 responsive to the control signal CNT4 from the P/F check & control logic 190 (step 22). The erase operation then returns to step 12. As the bulk step counter 180 is incremented, as illustrated in FIG. 5, the bulk voltage Vb is increased by a predetermined amount. The increase forces the electric field across the floating gates of all flash memory cells to be increased. If the value BS is not equal to the maximum value BSmax, the value BS is not incremented before the NGBE operation is executed at step 12.

If the selected memory cells have their threshold voltages equal to or less than the maximum value (+3V) of the target threshold voltage range corresponding to the on cell (step 16) the P/F check & control logic 190 checks whether or not the value Y of the Y-counter 150 is equal to its maximum value Ymax (step 24). If the value Y is less than the maximum value Ymax, the value Y is incremented by 1 responsive to the control signal CNT2 from the P/F check & control logic 190. Steps 16, 24, and 26 are repeated until the value Y reaches the maximum value Ymax. If the value Y is equal to the maximum value Ymax, the value X is checked to determine whether it has reached the maximum value Xmax (step 28). If the value X is less than the maximum value Xmax, the value X is incremented by 1 the control signal CNT3 generated by the P/F check & control logic 190 (step 30). The steps 16, 24, 28, and 30 are repeated until the value X is equal to the maximum value Xmax. If the value X is equal to the maximum value Xmax, the erase operation ends as erase pass.

The erase algorithm shown in FIG. 4, if the maximum value BSmax of the bulk step counter 180 is, for example, 9, the bulk voltage Vb is increased by the predetermined voltage step by step until the value BS reaches the maximum value BSmax=9V. The bulk voltage Vb supplied to the bulk during the NGBE operation, as illustrated in FIG. 5, is maintained constant (e.g., +9V) after the value BS reaches the maximum value (e.g., 9V).

When the value BS of the bulk step counter 180 is less than the maximum value BSmax, e.g., 5V,5, some of the flash memory cells in the sector 110 may have their threshold voltages distributed in the on state threshold voltage range. In this case, after increasing the bulk voltage Vb by the predetermined voltage, the NGBE operation is carried to shift the threshold voltages of the remaining flash memory cells into the target threshold voltage range. Since the bulk voltage Vb is increased, the strength of the electric field across the floating gate of each cell is increased. The increased electric field, in turn, increases the erase speed of the respective flash memory cells. For example, when the electric field is increased by 1V, the erase speed is a few times faster. Therefore, the threshold voltages of the sufficiently erased cells may be distributed below the minimum value (+1V) of the target threshold voltage range owing to the increase of the electric field that corresponds to the increased bulk voltage Vb. That is, the flash memory cells are over-erased, resulting in an increased total erase time.

Figure 6:
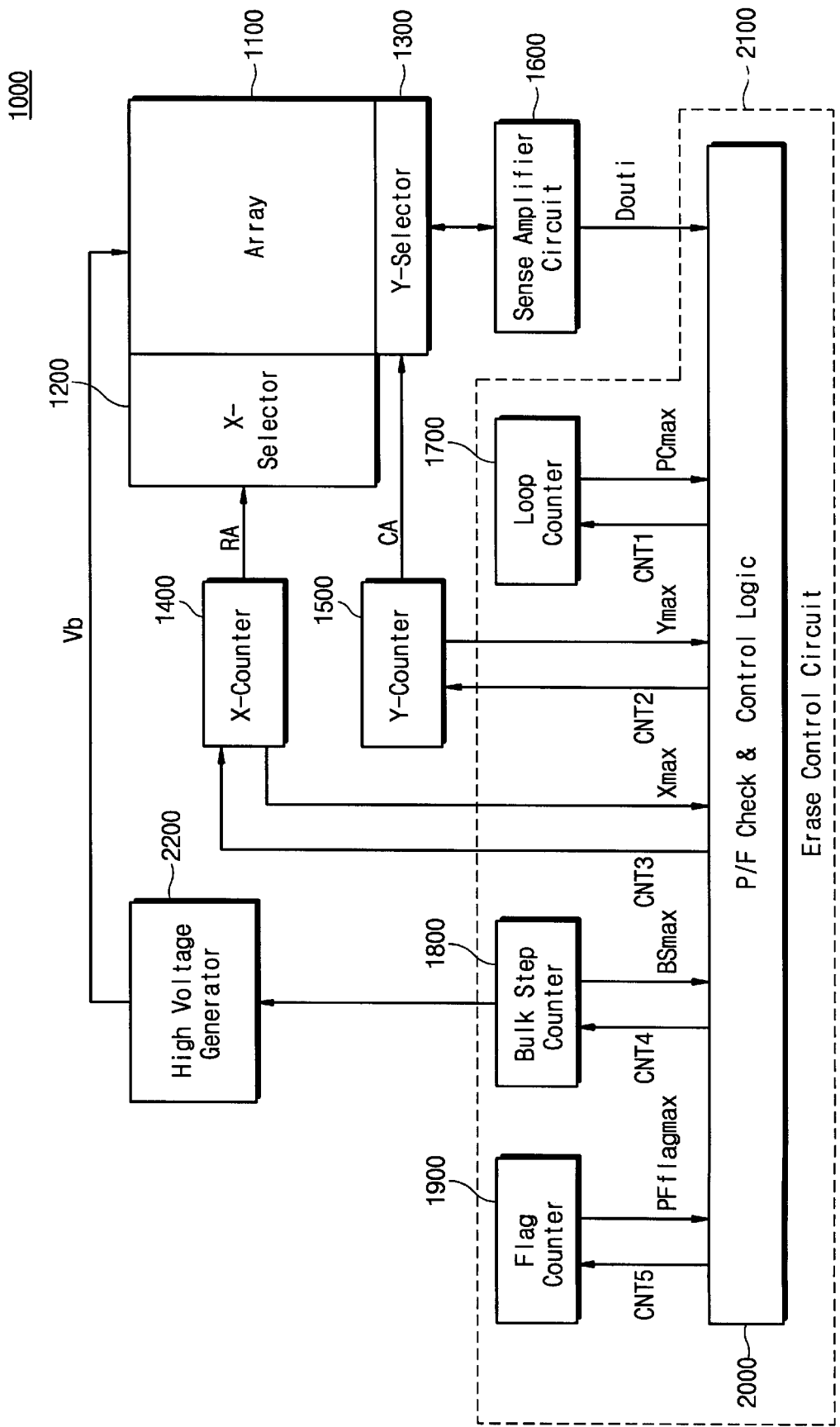
FIG. 6 is a block diagram of a flash memory device according to the present invention.

Referring to FIG. 6, a flash memory device according to the present invention is illustrated. The flash memory device 1000 includes an array 1100, row and column selecting circuits 1200 and 1300, respectively X-counter 1400, Y-counter 1500, sense amplifier circuit 1600, and high voltage generator 2200, operates similarly to analogous blocks shown in FIG. 3. The operation of the array 1100, row and column selecting circuits 1200 and 1300, respectively, Xcounter 1400, Y-counts 1500, sense amplifier 1600 and voltage generator 2000, therefore, will not be described in further detail.

The flash memory device 1000 further includes an erase control circuit 2100. The erase control circuit 2100 includes a loop counter 1700, a bulk step counter 1800, a flag counter 1900, and a pass/fail check & control logic 2000. The constituent elements of the erase control circuit 2100 will be more fully described below.

Figure 7:
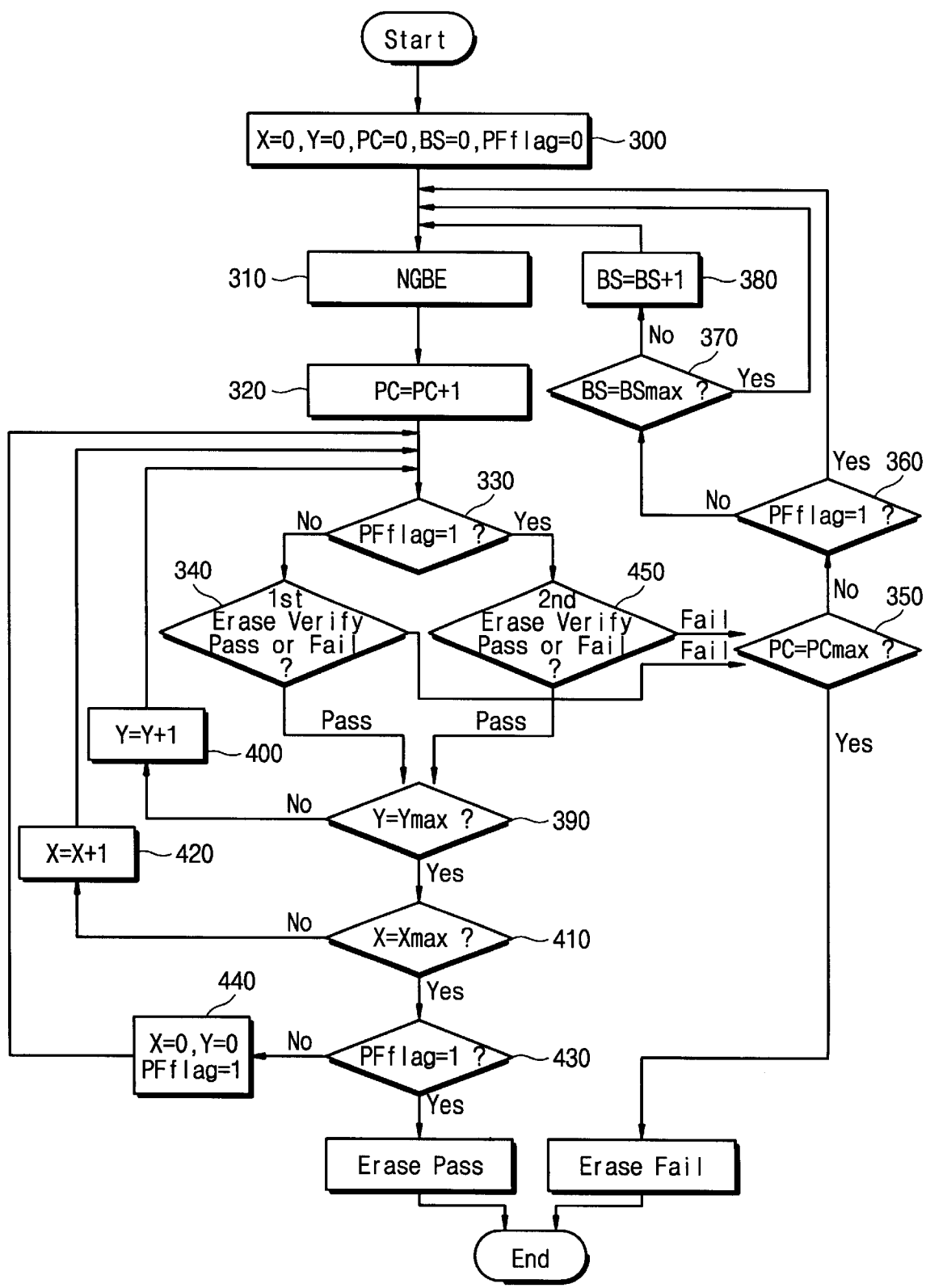
FIG. 7 is a flow chart of an erase operation according to the present invention.
Figure 8:
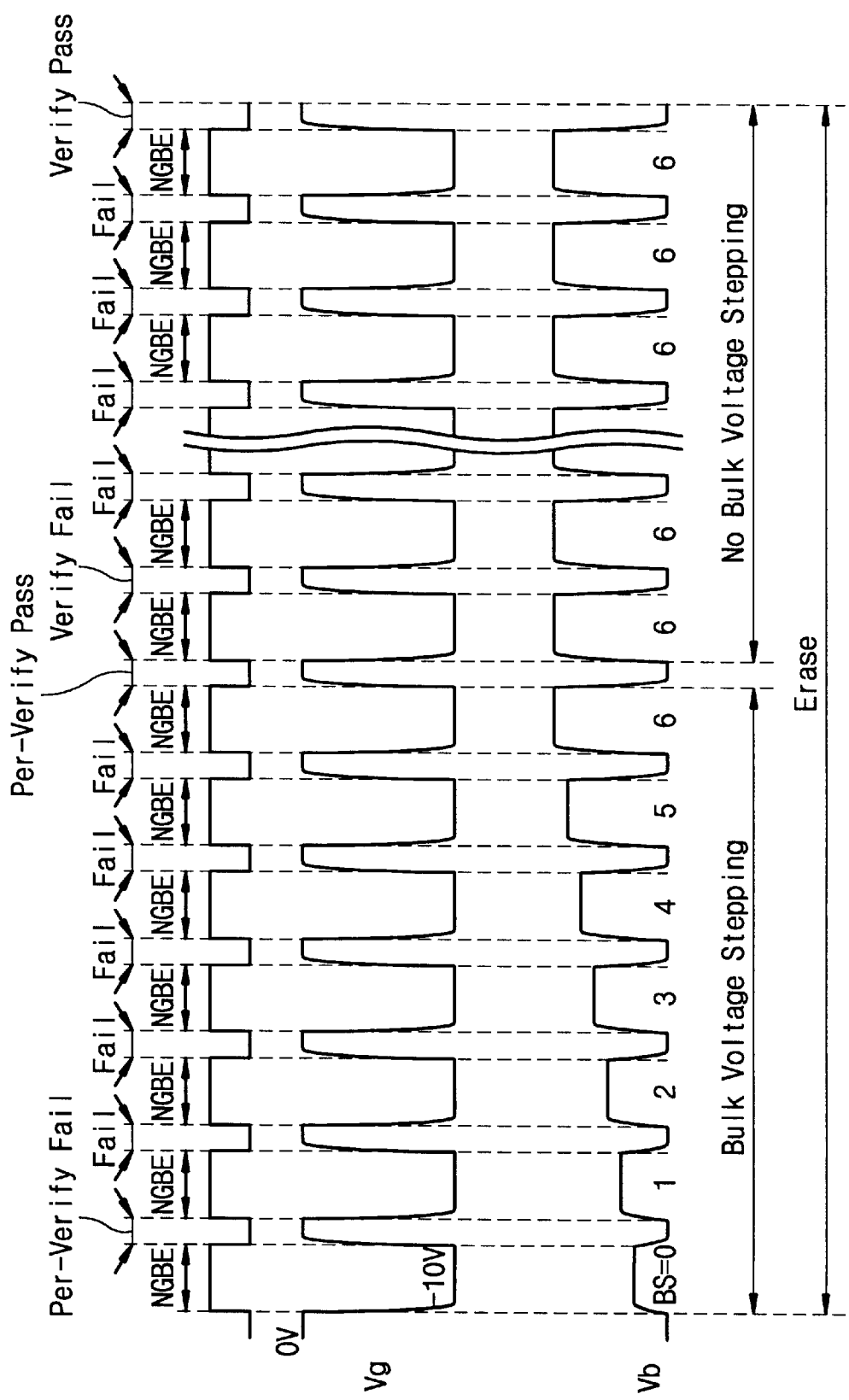
FIG. 8 is a diagram of bulk voltage variations according to the present invention.

FIG. 7 is a flow chart for describing the erase procedure according to the present invention. FIG. 8 is a diagram showing the bulk voltage variation according to the erase method of the present invention.

At step 300, the values X, Y, PC, BS and PFflag of the X-counter 1400, the Y-counter 1500, the loop counter 1700, the bulk step counter 1800, and the flag counter 1900 are reset to 0. At step 310, the NGBE operation is carried out by applying a voltage Vg of −10V to the wordlines, and a Vb of +6V to the bulk. At step 320, the value PC of the loop counter 1700 is incremented 1 responsive to the control signal CNT1 from the P/F check & control logic 2000. At step 330, the P/F check & control logic 2000 checks whether the value PFflag of the flag counter 1900 is 1.

If the value of the flag counter 1900 is not 1, the erase verification operation is carried out to check whether flash memory cells selected by initially set row and column addresses have their threshold voltages equal to or less than a predetermined pre-verify voltage $V_{PRE\_VERI}$ (e.g., +4V) (step 340). Hereinafter, the erase verification operation is termed "a pre erase verification operation". The pre-verify voltage $V_{PRE\_VERI}$ is set to have its voltage level higher than the maximum value (e.g., +3V) of the target threshold voltage range corresponding to the on state. The pre erase verification operation is carried out under the condition that the pre-verify voltage $V_{PRE\_VERI}$ of e.g., +4V is applied to a selected word line, the voltage Vd of +5V is applied to selected bit lines, and a ground voltage (e.g., 0V) is applied to the sources of the selected cells. During the pre erase verification operation, data Douti read out by the sense amplifier circuit 1600 is transferred to the P/F check & control logic 2000.

At step 340, the P/F check and control logic 2000 checks whether the threshold voltages of the selected flash memory cells are equal to or less than the pre-verify voltage $V_{PRE\_VERI}$. If at least one of the selected cells has its threshold voltage less than the pre-verify voltage $V_{PRE\_VERI}$, the value PC is checked against the maximum value PCmax (step 350). If the value PC reaches the maximum value PCmax, the erase procedure ends as an erase fail. When the value PC is less than the maximum value PCmax, the value PFflag of the flag counter 1900 is checked against 1 (step 360). If the value PFflag is not 1, steps 370 and 380 are carried in the same manner as those of the process shown in FIG. 3 so that the bulk voltage Vb is increased by a predetermined voltage. Doing so increases the electric field across the flash memory cells in the sector during the subsequent NGBE operation (step 310).

Returning to step 340, if the threshold voltages of the selected cells are equal to or less than the pre-verify voltage $V_{PRE\_VERI}$, the procedure goes to the step 390, in which the value Y of the Y-counter 1500 is incremented by 1. Steps 330, 340, 390, and 400 are repeated until the value Y reaches the maximum value Ymax. When the value Y is equal to the maximum value Ymax, the value X of the X-counter 1400 is compared to its maximum value Xmax (step 410). When the value X is less than the maximum value Xmax, the value X of the X-counter 1400 is incremented by 1 (step 420). Steps 330, 340, 390, 410, and 420 are repeated until the value X reaches the maximum value Xmax. If the value X of the X-counter 1400 is equal to the maximum value Xmax, the procedure goes to the step 430. At step 430, the value PFflag of the flag counter 1900 is checked against 1. If PFflag does not equal 1, the counters 1400 and 1500 are reset and the value PFflag of the flag counter 1900 is set to 1 (step 440). At step 330, the value PFflag is compared to 1.

Successively, the erase verification operation is carried out to check whether the flash memory cells selected by row and column addresses from the reset counters 1400 and 150 have their threshold voltages equal to or less than the maximum value (e.g., +3V) of the target threshold voltage range (step 450). Hereinafter, the maximum value is named "an erase-verify voltage". The erase verification operation is carried out under the following bias condition: a voltage Vg of +3V is applied to the selected word line; a voltage of +5V is applied to the selected bit lines; and the ground voltage is applied to the sources of the selected cells. Data Douti read out by the sense amplifier circuit 1600 at the erase verification operation is provided into the P/F check & control logic 2100.

If at least one of the selected cells has its threshold voltage higher than the erase verification voltage of about +3V, the value PC is compared to its maximum value PCmax (step 350). When PC=PCmax, the erase procedure ends as an erase fail. On the other hand, when PC<PCmax, the value PFflag is compared to 1 (step 360). As set forth above, since the value PFflag of the flag counter 1900 is set to 1 at the step 440, the procedure goes to the step 310, in which the NGBE operation is carried out without incrementing the bulk voltage Vb. That is, the NGBE operation is carried out using a bulk voltage Vb that is the same as that used in the pre erase verification operation. The bulk voltage Vb is maintained constant resulting in a constant strength electric field across the floating gate of each cell.

As described above, while the pre erase verification operation is performed, the bulk voltage Vb is increased step by step. That is, as illustrated in FIG. 8, the bulk voltage Vb is increased by the predetermined voltage step by step during the NGBE operation performed until the threshold voltages of all flash memory cells in the sector 1100 reach the pre-verify voltage $V_{PRE\_VERI}$. If the threshold voltages of all of the flash memory cells are equal to the pre-verify voltage $V_{PRE\_VERI}$, the NGBE operation is carried out without incrementing the bulk voltage Vb, that is, under a constant bulk voltage Vb.

Figure 9A:
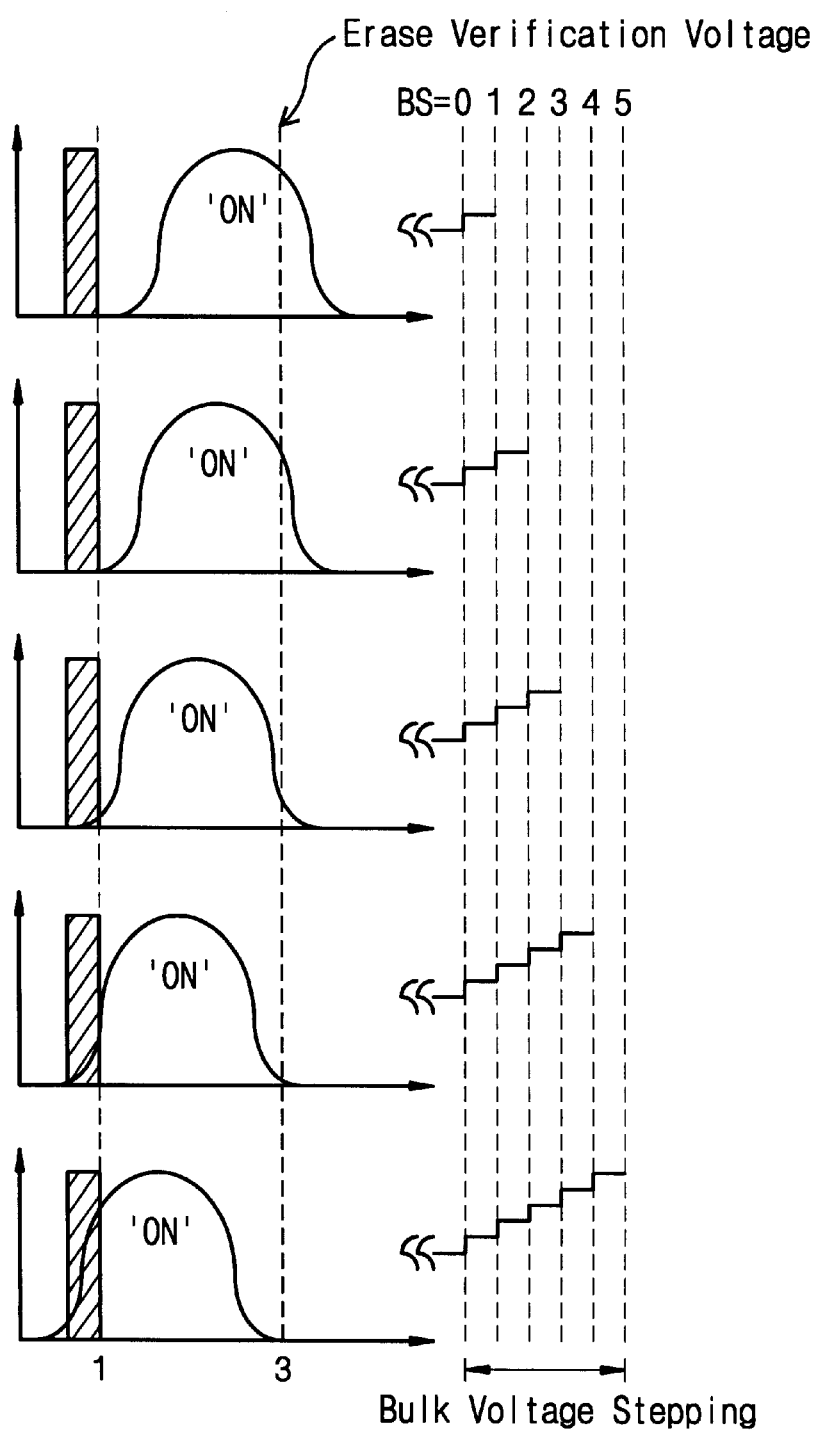
FIGS. 9A–9B are diagrams for comparing a threshold voltage distribution of an erased memory cell of the present invention with a threshold voltage distribution of an erased memory cell for the device shown in FIG. 3.
Figure 9B:
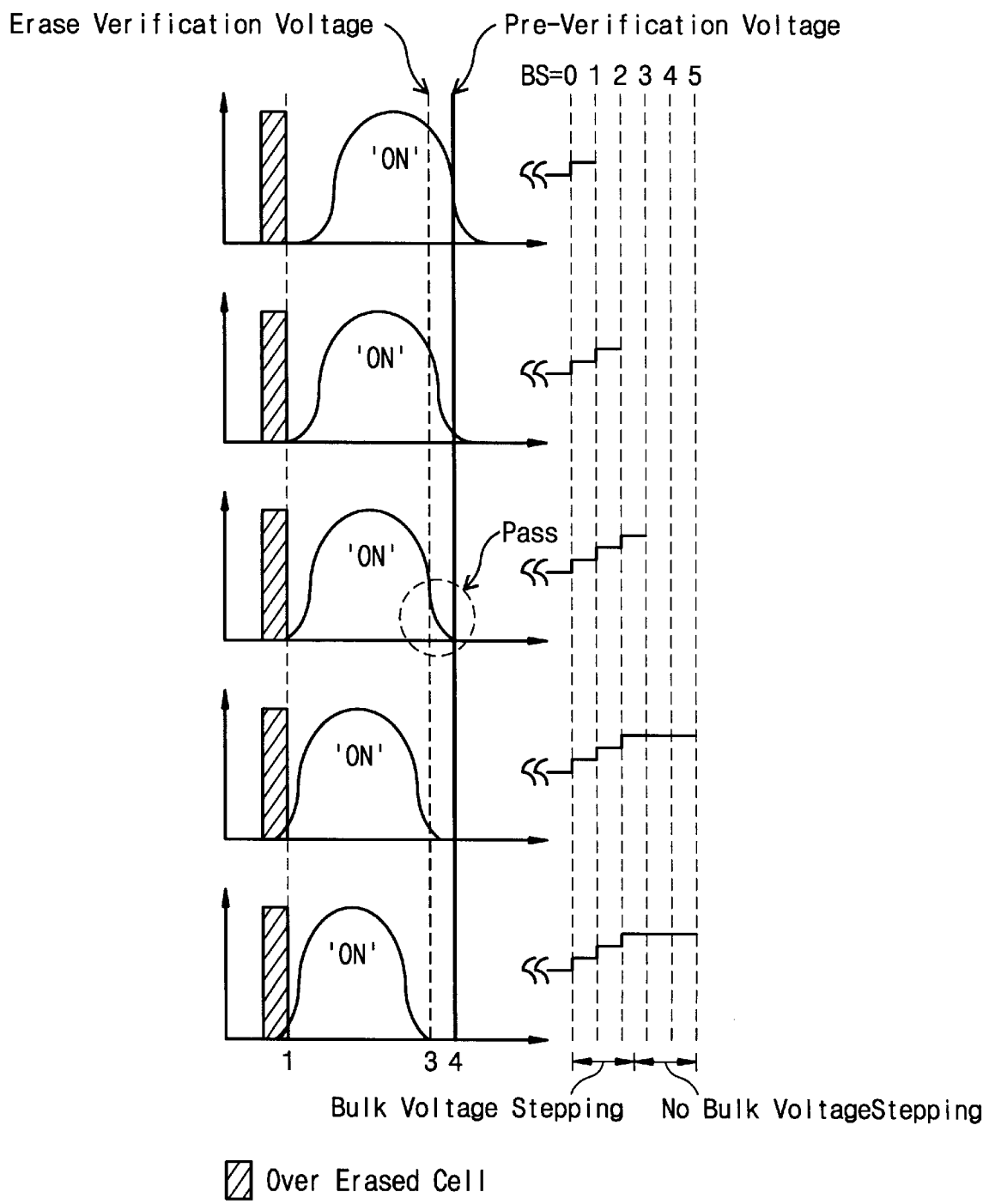

Variations of the threshold voltage distribution according to the present invention are illustrated in FIG. 9. According to the erase algorithm of the present invention for increasing the bulk voltage Vb at the pre erase verification operation and for maintaining the bulk voltage Vb constant after the pre erase verification operation, as illustrated in FIG. 9, the flash memory cells are prevented (or suppressed) from being over-erased as compared with the erase algorithm shown in FIG. 3 using as an erase verification voltage the maximum value (e.g., +3V) of the target threshold voltage range corresponding to the on state. As a result, the time required to the erase repair operation is reduced resulting in a consequent reduction in a total erase time.

Although the present invention is expressed using the erase method where the bulk voltage in increased step by step, it is obvious that the present invention can be applied to an erase method where a word line voltage is increased step by step. Furthermore, the erase method of decreasing the bulk voltage step by step can be incorporated in the scope of the present invention. Although the pre erase verification operation is shown as performed a single time, a person skilled in the art should recognize that the pre-erase verification operation can be carried out a number of times using various pre-verify voltage levels.

The invention has been described using exemplary preferred embodiments. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A method for erasing flash memory cells in an array formed on a semiconductor substrate, each cell having and ON and an OFF state and a source, drain, and control gate, the method comprising:

applying a first electric field between the control gate of a corresponding memory cell and the semiconductor substrate during a first interval;

step-wise incrementing the first electric field during the first interval;

applying a second electric field between the control gate of the corresponding memory cell and the semiconductor substrate during a second interval; and maintaining constant the second electric field during the second interval.

2. The method of claim 1 wherein applying the first electric field includes applying the first electric field when a threshold voltage of the corresponding memory cell is higher than a verify voltage.

3. The method of claim 1 wherein applying a second electric field includes applying a second electric field when a threshold voltage of one of the memory cells is equal to or greater than a verify voltage.

4. The method of claim 1 wherein the verify voltage is greater than a maximum value of a target threshold voltage range corresponding to the ON state.

5. The method of claim 1 wherein applying the second electric field includes applying the second electric field equal in strength to the first electric field when a threshold voltage of at least one memory cell is equal to or greater than the verify voltage.

6. The method of claim 1 wherein applying the first electric field comprises:

erasing the memory cells by applying a negative voltage to corresponding control gates and a positive bulk voltage to the semiconductor substrate;

verifying whether a threshold voltage of the corresponding memory cells is equal to or greater than the verify voltage;

increasing the positive bulk voltage by a predetermined voltage when the threshold voltage of the corresponding memory cells is over the verify voltage; and repeatedly erasing, verifying, and increasing until the threshold voltage of at least one memory cell is equal to or greater than the verify voltage.

* * * * *